(12) United States Patent
Hsieh et al.

(10) Patent No.: US 6,204,126 B1
(45) Date of Patent: Mar. 20, 2001

(54) METHOD TO FABRICATE A NEW STRUCTURE WITH MULTI-SELF-ALIGNED FOR SPLIT-GATE FLASH

(75) Inventors: Chia-Ta Hsieh, Tainan; Tai-Fen Lin, Hsin-chu; Wen-Ting Chu, Kaohsiung County; Chuang-Ke Yeh, Hsin-Chu; Hung-Cheng Sung, Hsin-Chu; Di-Son Kuo, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/506,930

(22) Filed: Feb. 18, 2000

(51) Int. Cl.[7] .................................................. H01L 21/336
(52) U.S. Cl. ........................ 438/267; 438/257; 438/259; 438/262
(58) Field of Search .................................. 438/257, 259, 438/263, 264, 266, 267, 261, 262, 258

(56) References Cited

U.S. PATENT DOCUMENTS

| | | | |
|---|---|---|---|
| 5,427,968 | 6/1995 | Hong | 437/43 |
| 5,614,747 | * 3/1997 | Ahn et al. | 257/316 |
| 5,652,161 | 7/1997 | Ahn | 437/43 |
| 5,851,881 | 12/1998 | Lin et al. | 438/261 |
| 5,858,840 | 1/1999 | Hsieh et al. | 438/266 |
| 5,879,992 | 3/1999 | Hsieh et al. | 438/264 |
| 5,918,125 | * 7/1999 | Guo et al. | 438/264 |
| 5,950,087 | * 9/1999 | Hsieh et al. | 438/264 |
| 5,981,340 | * 11/1999 | Chang et al. | 438/258 |
| 5,989,960 | * 11/1999 | Fukase | 438/267 |
| 6,005,807 | * 12/1999 | Chen | 365/185.12 |
| 6,130,132 | * 10/2000 | Hsieh et al. | 438/264 |
| 6,133,098 | * 10/2000 | Ogura et al. | 438/267 |
| 6,153,494 | * 11/2000 | Hsieh et al. | 438/424 |

\* cited by examiner

Primary Examiner—Trung Dang
Assistant Examiner—Brook Kebede
(74) Attorney, Agent, or Firm—George O. Saile; Stephen B. Ackerman; Sevgin Oktay

(57) ABSTRACT

A method is disclosed for forming a split-gate flash memory cell where the floating gate of the cell is self-aligned to isolation, to source and to word line. This multi-self-aligned structure, which provides the maximum shrinkage of the cell that is possible, is also disclosed. The multi-self-alignment is accomplished by first defining the floating gate at the same time the trench isolation is formed, and then self-aligning the source to the floating gate by using a nitride layer as a hard mask in place of the traditional polyoxide, and finally forming a polysilicon spacer to align the word line to the floating gate. Furthermore, a thin floating gate is used to form a thin and sharp poly tip through the use of a "smiling effect" to advantage. The tip substantially decreases the coupling ratio of the floating gate to the word line for fast erasing speed, while at the same time increasing the coupling of the source to the floating gate with the attendant increase in the programming speed of the split gate flash memory cell.

20 Claims, 6 Drawing Sheets

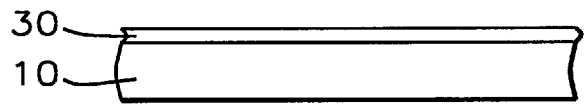
FIG. 1a -
Prior Art
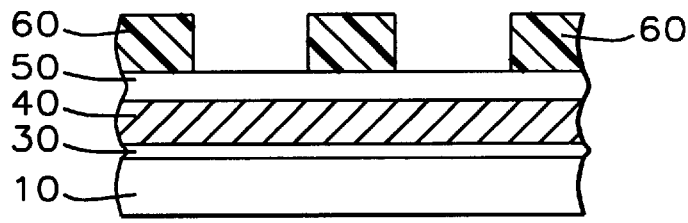
FIG. 1b -
Prior Art
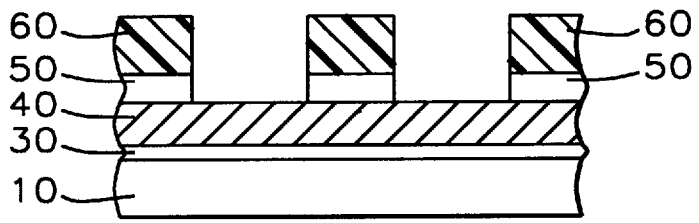
FIG. 1c -
Prior Art
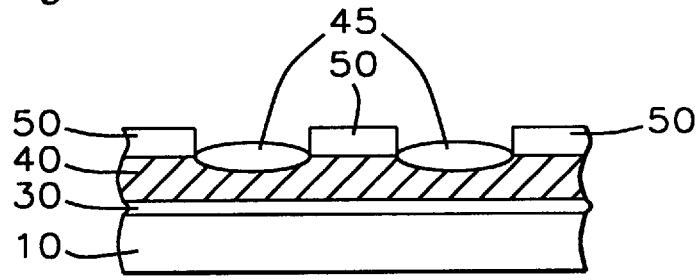
FIG. 1d -
Prior Art

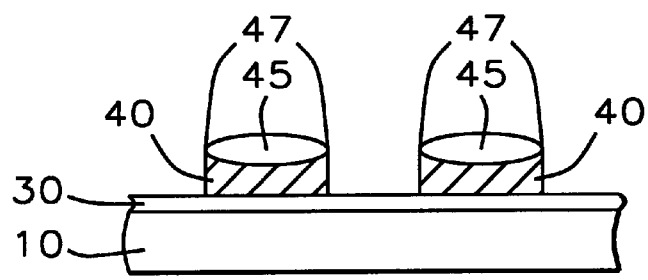
*FIG. 1e - Prior Art*
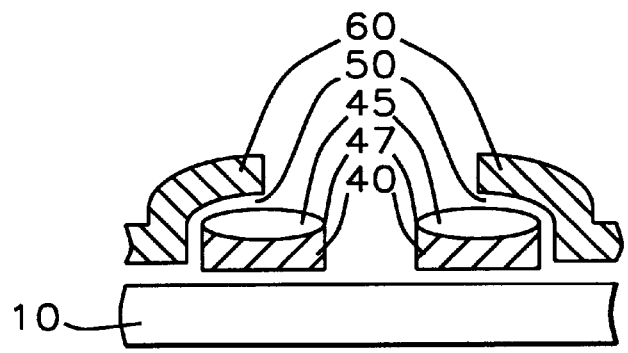
*FIG. 1f - Prior Art*
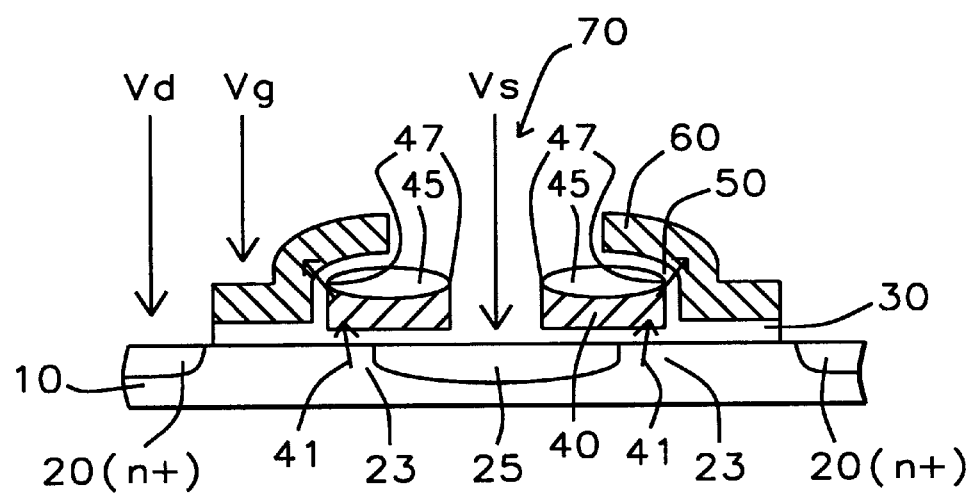
*FIG. 1g - Prior Art*

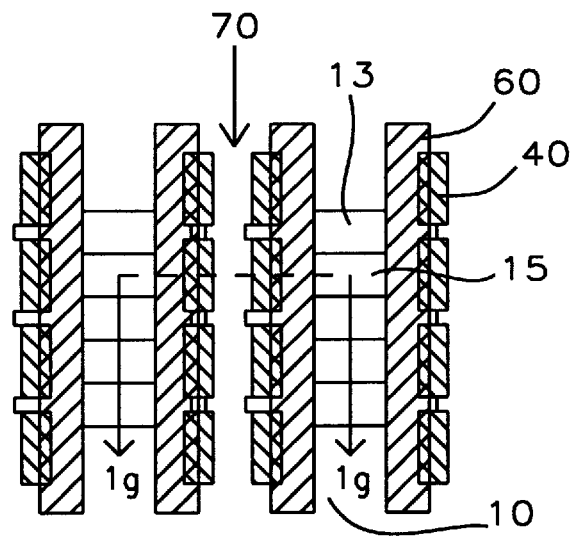
FIG. 1h – Prior Art
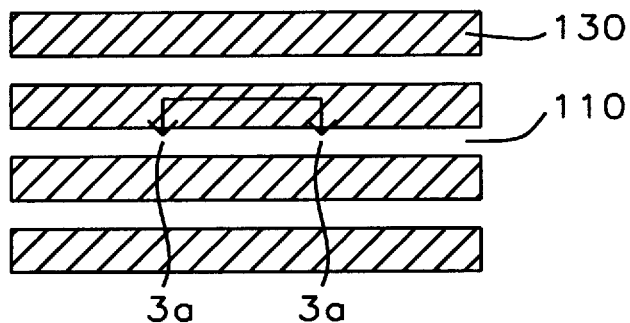
FIG. 2a
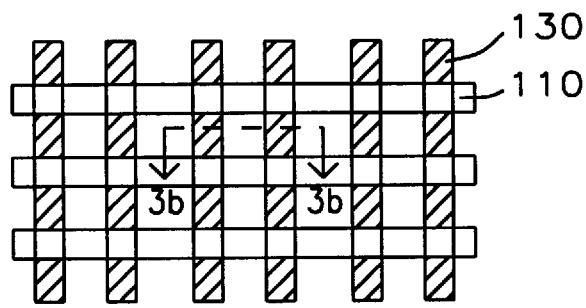
FIG. 2b

US 6,204,126 B1

METHOD TO FABRICATE A NEW STRUCTURE WITH MULTI-SELF-ALIGNED FOR SPLIT-GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of forming a split-gate flash memory cell having multi-self-aligned structure.

(2) Description of the Related Art

One of the important drivers for increased performance in computers is the higher levels of integration of circuits. This is accomplished by miniaturizing or shrinking device sizes on a given chip. Tolerances play an important role in being able to shrink dimensions on a chip. Self-alignment of various components in a device can help reduce those tolerances and improve packing density of chips. As is known in the art, a split-gate flash memory cell normally has a floating gate, a control gate, source and drain regions, and none of them are usually self-aligned with respect to each other. That is, floating gate is not aligned to the cell isolation regions, nor to the common source line, nor to the control gate, or word line. This is primarily because of the poly oxide process employed in forming the floating gate. Consequently, it is difficult to shrink such a device. It is disclosed later in the embodiments of the present invention a method of forming a multi-self-aligned structure where the memory cell can be substantially reduced in size with the attendant improved packing density and performance.

A method of forming a conventional split-gate flash memory cell is shown in FIG. 1a where a layer of gate oxide (30) is thermally grown over substrate (10). Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The photoresist layer, which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are covered by the polyoxide (FIG. 1e). As is well known in the art, this is usually accomplished by main etch followed by over-etch. It is at this etching step that the corner edge (47) is usually rounded off, as seen in FIG. 1e, which is not desirable for achieving fast program erase speed described below. It will be shown later in the embodiments of this invention that by employing a "smiling effect", the sharpness of corner edge (47) can be improved such that charge transfer between substrate (10) and floating gate (40), and then the charge transfer between the floating gate and control gate, (60), is fast. The control gate is formed by depositing a second polysilicon layer over intergate layer (50), also known as interpoly, which separates the two polysilicon layers, namely, the floating polygate and the control polygate. The completed split-gate cell structure is shown in FIG. 1f.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMS). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

FIG. 1g, which is an enlarged view of FIG. 1f, is a conventional flash-EEPROM cell where two MOS transistors share a common source (25). A top view is shown in FIG. 1h. FIG. 1g is a cross-sectional view of the cell taken at 1g—1g crossing active region (15) defined by passive filed oxide or isolation region (13). A top view of the shared common source line is referenced as (70) in FIG. 1h.

In the cross-sectional view 1g, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

To program the transistor shown in FIG. 1g, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (25), Vs, drain (20), Vd, and to control gate (60), Vg, and then sensing the amount of charge on floating gate (40). To erase the contents of the cell, charges are removed from the floating gate by transferring them to the word line (control gate) through the gate oxide. The path of the charge transfer is shown by arrows (41) in FIG. 1g.

This programming and erasing of an EEPROM is accomplished electrically and in-circuit by using Fowler-Nordheim (FN) tunneling for erasing, and channel-hot electron (CHE) injection for programming, as is well known in the art. FN tunneling usually requires higher voltage than the CHE mechanism. It is common practice use FN tunneling for both write and erase for NAND type of cell architecture, while CHE programming and FN tunneling erasure is used for NOR circuits. The latter approach is shown in FIG. 1g. Thus, in the programming mode, source (25) is coupled to the floating gate through a high voltage which in turn creates a high electric field between floating gate (40) and control gate (60), thereby causing injection of CHEs from substrate (10) to floating gate (40) in FIG. 1g. In the erase mode, on the other hand, the control gate is impressed with a high voltage and electrons are injected from the floating gate to the control gate through the FN tunneling mechanism, usually aided by the poly tip of the floating gate.

In the conventional memory cell shown in FIG. 1g, word lines (not shown) are connected to control gate (60) of the MOS transistor, while the length of the MOS transistor itself is defined by the source (25) drain (20) n+ regions shown in the same Figure. As is well known by those skilled in the art, the transistor channel is defined by masking the n+ regions. However, the channel length of the transistor varies depending upon the alignment of the floating gate (40) with the source and drain regions. This introduces significant variations in cell performance from die to die and from wafer to wafer. Furthermore, the uncertainty in the final position of the n+ regions causes variations in the series resistance of the bit lines connected to those regions, and hence additional variation in the cell performance. The multi-self-aligned structure of the present invention resolves the uncertainty of the prior art.

Erasing and programming speed of a split gate flash memory cell is governed by the capacitive coupling between different parts of the cell. As it will be described more fully later, the programming and erasing of the cell is accomplished by transferring charges between polysilicon or poly parts comprising the floating gate, control gate and the source region in the device substrate. A faster erase speed is achieved if the coupling ratio between the control gate and the floating gate is low, which in turn, is attained by having a thinner floating gate as well as a sharper edge on the gate. With conventional methods of forming split gate cells, it is difficult to have low coupling ratio because of the relatively tall sidewalls of the floating gate. This is compensated to a large extent by forming a sharp edge or tip on the floating gate. On the other hand, higher programming speed is achieved if the coupling ratio between the floating gate and the source region is higher, which can be attained with a thinner floating gate. It is disclosed in the embodiments of the present invention a method of forming a split gate flash memory cell having a thin floating gate and a sharp poly tip in order to improve erasing and programming speed of the cell. The method involves the use of a nitride layer in place of the poly oxide that is conventionally employed in forming the floating gate, and also using to advantage a so-called "smiling effect" which is normally taught away.

In U.S. Pat. No. 5,879,992, Hsieh, et al., provide a method for forming a split-gate flash memory cell having a step poly supporting an interpoly oxide of varying thickness for the purposes of improving the over-all performance of the cell. Polyoxide is formed over portions of a first polysilicon layer which in turn is partially etched to form a step adjacent to the side-wall of a floating gate underlying the polyoxide. A spacer is next formed of a hot temperature oxide over the step poly. An interpoly oxynitride is then formed and control gate is patterned overlapping the floating gate with the intervening interpoly oxide. The step poly and the spacer thereon form proper distances between the control gate and the floating gate while keeping the distance between the poly tip and the control gate unchanged so that appropriate couplings between the control gate and the floating gate, and between the floating gate and the substrate are achieved, thus improving the over-all performance of the split-gate flash memory having a step poly.

In another U.S. Pat. No. 5,858,840, Hsieh, et al., propose a method for forming a short and sharp gate bird's beak in order to increase the erase speed of a split-gate flash memory cell. This is accomplished by implanting nitrogen ions in the first polysilicon layer of the cell and removing them from the area where the floating gate is to be formed. Then, when the polysilicon layer is oxidized to form polyoxide, the floating gate region without the nitrogen ions oxidizes faster than the surrounding area still having the nitrogen ions. Consequently, the bird's beak that is formed at the edges of the polyoxide assumes a sharper shape with smaller size than that is found in prior art. This results in an increase in the erase speed of the memory cell.

A different method of making a split-gate flash EEPROM cell is disclosed by Ahn in U.S. Pat. No. 5,652,161. The method prevents the degradation of the tunnel oxide film of the cell due to the band-to-band tunneling and the secondary hot carrier which are generated by a high electric field formed at the overlap region between the junction region and the gate electrode when programming and erasure operations are performed by a high voltage to the structure in which the tunneling region is separated from the channel with a thick insulation film.

Still another method of making a flash memory for multi-level logic is shown by Lin, et al., in U.S. Pat. No. 5,851,881. The memory device has a poly stacked gate transistor in series with a MONOS transistor. The method begins by forming a tunnel oxide layer on the surface of a semiconductor substrate. The substrate has a stacked gate channel area and a MONOS channel area in the active regions. A poly floating gate electrode is formed over the stacked gate channel region. An ONO layer having a memory nitride layer is formed over the floating gate and the tunnel oxide layer over the MONOS channel region. A control gate electrode is formed over the ONO layer spanning across the poly floating gate electrode and the MONOS channel region. Source/drain regions are formed in the substrate. A poly flash transistor and a MONOS flash transistor combine to form the 4 level logic memory cell of the invention.

Hong, on the other hand, discloses in U.S. Pat. No. 5,427,968 an electronically erasable and reprogrammable memory integrated circuit device having split-gate memory cell with separated tunneling. A silicon substrate having field oxide layers isolating component regions are processed to construct a memory cell in each of the isolated component region. Each of the memory cells includes a drain and source region formed in the silicon substrate, with a channel formed between the drain and source regions. Ring-shaped floating gate surrounds and covers the periphery of the channel and is isolated with the drain and source regions respectively by two thin tunneling oxide layers that are separated from each other. The two separated tunneling oxide layers constitute two separated tunneling regions. A control gate layer covers the ring-shaped floating gate and the portion of the channel that is not covered by the floating gate layer, and is separated from the floating gate by an isolation layer. A gate oxide layer is formed between the control gate layer and channel.

It will be apparent to those skilled in the art that prior art provides methods for partially improving the performance of memory devices through reshaping and reforming the poly tip, affecting the coupling ratios between the substrate and the floating gate, and between the floating gate and the control gate, and also by providing partial self-alignment between different parts, of the cell. It is disclosed later in the embodiments of the present invention a multi-self-aligned structure where all the parts, namely, the floating and control gates, and source and drain regions, are all aligned with respect to each other. This arrangement provides the maximum shrinkage of the cell that is possible. Furthermore, the method makes it possible, through the use of "smiling effect", to form a thin and sharp poly tip in the floating gate, thereby improving the coupling ratio, and hence the over-all performance of the split-gate flash memory device.

SUMMARY OF THE INVENTION

It is therefore an object of this invention to provide method of forming a multi-self-aligned cell structure to improve packing density and performance of split-gate flash memory devices.

It is another object of the present invention to provide a method for self-aligning floating gate to cell isolation, self-aligning floating gate to common source line, and self-aligning floating gate to control gate, or word line, all in the same multi-self-aligned split-gate flash memory cell structure.

It is still another object of this invention to provide a method of forming a thin floating gate with a sharp poly tip in order to decrease the coupling ratio of the floating gate to the word line for fast erasing speed, while at the same time increasing the coupling of the source to the floating gate in order to increase the programming speed of the split gate flash memory cell.

It is yet another object of this invention to provide a multi-self-aligned structure where all the parts, namely, the floating and control gates, and source and drain regions, are all aligned with respect to each other with the attendant improvement in the over-all performance of a split-gate flash memory cell. This structure provides the maximum shrinkage of the cell that is possible.

These objects are accomplished by providing a semiconductor substrate having shallow trench isolation (STI) formed therein and active regions defined; forming a gate oxide layer over said substrate; forming a thin floating gate over said gate oxide layer, wherein said floating gate is vertically self-aligned to said STI; forming a high temperature oxide (HTO) layer over said thin floating gate; forming a thick nitride layer over said HTO layer; growing an inter-poly oxide layer over said thick nitride layer, wherein a sharp thin poly tip is formed employing smiling effect in said thin floating gate; forming a spacer control gate over said inter-poly oxide wherein said spacer control gate is vertically self-aligned to said floating gate; forming a common source line self-aligned to said floating gate and said control gate; and forming a drain to complete forming of said split-gate flash memory cell.

These objects are accomplished further by providing a semiconductor substrate having shallow trench isolation (STI); a gate oxide layer over said substrate; a thin floating gate over said gate oxide layer, wherein said floating gate is vertically self-aligned to said STI; a thin sharp poly tip in said floating gate; a high temperature oxide (HTO) layer over said thin floating gate; a thick nitride layer over said HTO layer; an inter-poly oxide layer over said thick nitride layer; a spacer control gate over said inter-poly oxide wherein said spacer control gate is vertically self-aligned to said floating gate; a common source line self-aligned to said floating gate and said control gate; and a drain to complete said split-gate flash memory cell.

BRIEF DESCRIPTION OF THE DRAWINGS

FIG. 1a is a cross-sectional view of a portion of a semiconductor substrate showing the forming of a gate oxide layer, according to prior art.

FIG. 1b is a cross-sectional view of a portion of a semiconductor substrate showing the forming of a first polysilicon later followed by a first nitride layer over the gate oxide layer of FIG. 1a, and the patterning thereof, according to prior art.

FIG. 1c is a cross-sectional view of a portion of a semiconductor substrate showing the patterning of the first nitride layer of FIG. 1b, according to prior art.

FIG. 1d is a cross-sectional view of a portion of a semiconductor substrate showing the forming of polyoxide over the polysilicon layer of FIG. 1c, according to prior art.

FIG. 1e is a cross-sectional view of a portion of a semiconductor substrate showing the etching of the first polysilicon layer of FIG. 1d to form a floating, according to prior art.

FIG. 1f is a cross-sectional view of a portion of a semiconductor substrate showing the forming of the control gate of the cell of FIG. 1e, according to prior art.

FIG. 1g is an enlarged view of FIG. 1f, showing the source and drain and the corresponding voltages, according to prior art.

FIG. 1h is a top view showing the active and passive regions of the substrate of FIG. 1g, according to prior art.

FIGS. 2a–2e show the top view of a portion of a semiconductor substrate of this invention, while

Figure 2C:
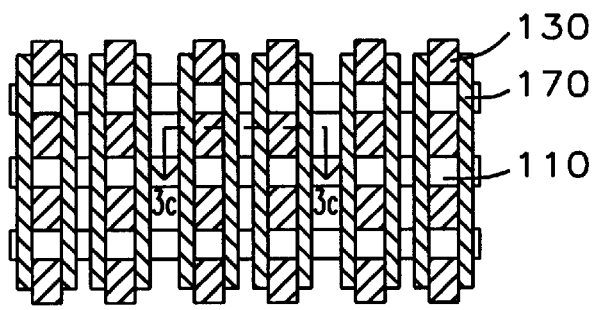

More specifically,

FIGS. 2a–3a are top and cross-sectional views, respectively, of a semiconductor substrate showing the forming of a shallow trench isolation (STI) region and an active region of the memory cell of the present invention.

FIGS. 2b–3b are top and cross-sectional views, respectively, of a semiconductor substrate showing the self-alignment of the floating gate to the STI of FIG. 2a, according to the present invention.

FIGS. 2c–3c are top and cross-sectional views, respectively, of a semiconductor substrate showing the forming of the polysilicon spacers as the control gate of the disclosed cell, according to the present invention.

FIGS. 2d–3d are top and cross-sectional views, respectively, of a semiconductor substrate showing the self-alignment of the floating gate as well as the control gate (word-line) to the source line to the STI of FIGS. 2a–3a, according to the present invention.

FIGS. 2e–3e are top and cross-sectional views, respectively, of a semiconductor substrate showing the self-alignment of the floating gate as well as the control gate (word-line) to the source line of FIGS. 2d–3d, according to the present invention.

FIG. 2f is a transverse cross-sectional view of a portion of a semiconductor substrate showing the self-alignment of the floating gate to the STI of this invention.

DESCRIPTION OF THE PREFERRED EMBODIMENTS

Referring now to the drawings, in particular to FIGS. 2a–2e and FIGS. 3a–3f, there are shown schematically steps of forming a split-gate flash memory cell where the floating gate of the cell is self-aligned to isolation, to source and to word line. This multi-self-aligned structure, which provides the maximum shrinkage of the cell that is possible, is also disclosed in another embodiment. The multi-self-alignment is accomplished by first defining the floating gate at the same time the trench isolation is formed, and then self-aligning the source to the floating gate by using a nitride layer as a hard mask in place of the traditional polyoxide, and finally forming a polysilicon spacer to align the word line to the floating gate. Furthermore, a thin floating gate is used to form a thin and sharp poly tip through the use of a "smiling effect" to advantage.

More specifically, FIGS. 2a–2e show the top views of semiconductor substrate, preferably silicon, at different process steps of forming the multi-self-aligned split-gate flash cell of the invention. FIGS. 3a–3f are cross sections taken at the corresponding cuts shown in FIGS. 2a–2e.

Figure 3A:
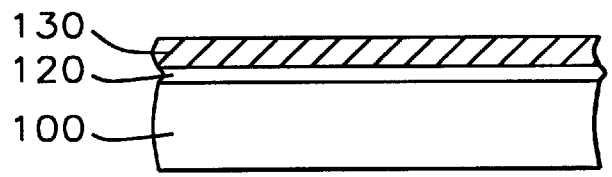
FIGS. 3a–3f show cross-sectional views of the same substrate.

As shown in FIG. 3a, a gate oxide layer, (120), is formed over substrate (100). First polysilicon layer (130) is formed over the gate oxide layer, which is followed by the forming of a first nitride layer over the first polysilicon layer. Following methods well known in the art, substrate (100) is formed with shallow trench isolation (STI) regions (110) separating active device regions as shown in FIG. 2a. A cross-sectional view of an active region is shown in FIG. 3a, while a cross-sectional view of the STI region can be better seen in FIG. 3f. Trench (110) has a depth between about 2500 to 4500 Å, and is filled with low pressure chemical vapor deposition oxide.

It is preferred that gate oxide (120)) has a thickness between about 70 to 100 angstroms (Å). It can be formed by thermal oxidation process at a temperature between about 750° C. to 950° C. Alternatively, the gate oxide can be formed by an atmospheric or low pressure chemical vapor deposition (LPCVD) process as is well known. First polysilicon layer (130) is formed over the gate oxide layer through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 530 to 650° C. It is important that the thickness of the first polysilicon layer is thin in a range between about 50 to 150 Å. It will be shown later that the thin polysilicon forms a sharp tip at a subsequent step of oxidation. The first nitride layer (not shown) over first polysilicon layer (130) is removed after using it to define active regions following the traditional STI process. The preferred thickness of the first nitride layer is between about 1400 to 1600 Å and is formed by reacting dichlorosilane ($SiCl_2H_2$), or silane ($SiH_4$) at a temperature between about 650 to 800° C.

Figure 3B:
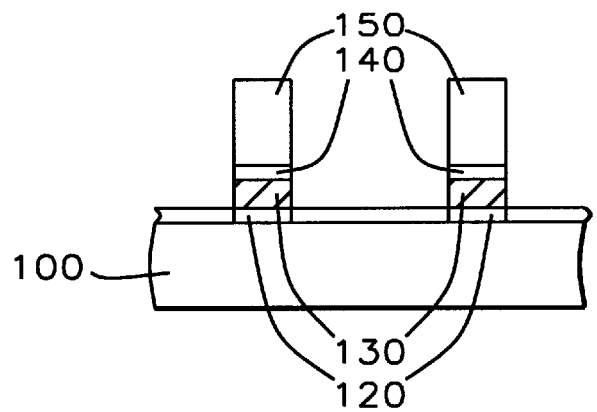

At the next step, hot temperature oxide (HTO) layer (140) is formed at a temperature between about 750 to 900° C. with a preferred thickness between about 50 to 100 Å. A second nitride layer, (150), is formed over the HTO layer as shown in FIG. 3b. The second nitride layer has a thickness between about 900 to 1100 Å. A first photoresist mask (not shown) is then formed over the second nitride layer to perform the next important step of defining the floating gate of the multi-self-aligned split-gate flash of the instant invention. This is accomplished by etching the second nitride layer, the underlying HTO and first polysilicon layers through the patterns in the first photoresist mask defining the floating gate. Subsequently, the first photoresist mask is removed. It will now be apparent to those skilled in the art that the floating gate is thus self-aligned to trench isolation (110) as can be seen better in FIG. 3f. A top view is also shown in FIG. 2b.

Figure 3C:
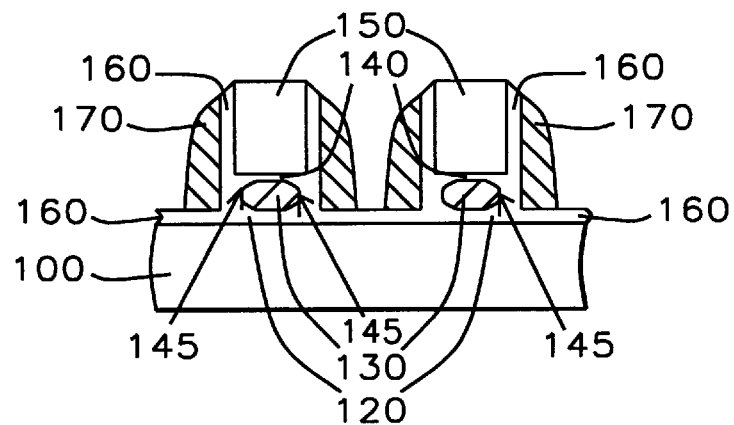

Next, a layer of interpoly oxide (160) is formed over the substrate, and is preferably formed at a temperature between about 750 to 900° C. It will be observed that a thin poly yields a sharp poly tip in the first instance. However, oxidation process yields a sharper poly tip. That is, the thickening of oxide layer (140) at corners shown in FIG. 3c is allowed until sharp tip (145) is formed in the first polysilicon layer of the floating gate. It will be better appreciated now that the thinness of the first polysilicon layer further aids in the forming of the thin and sharp poly tip. It will also be apparent to those skilled in the art that the disclosed nitride layer (150) in FIG. 3b takes the place of a polyoxide that would normally be formed using conventional methods, such as oxidizing the first polysilicon layer. It is well known, however, that polyoxides so formed create in the underlying polysilicon layer a poly tip that is thick and rounded, which, therefore, does not enhance the coupling between the floating gate and the control gate that is to be formed subsequently. It will be noted that at the same time the interpoly or intergate oxide is formed through the oxidation process, the upper edges of the first polysilicon layer are also oxidized to further shape the poly tip into a sharp, wedge form (145).

The thermal growth of the interpoly oxide promotes the so-called "smiling effect", which in turn, forms a thin and sharp poly tip in the first polysilicon layer. "Smiling" effect refers to the thickening of the edges (145), or "lips" of the interpoly oxide above the polysilicon floating gate of the cell by the diffusion of oxygen caused as will be apparent to those skilled in the art during the forming of the interpoly oxide. That is, during oxidation, oxygen diffuses into the polysilicon as well as into the interpoly oxide, thus growing edges which become larger than its original thickness, thereby resulting in a structure having a "smiling" face. Usually, "smiling effect" will result in a thicker oxide when it is allowed to form in the floating gate oxide between the floating gate and the substrate. However, the same effect can be used to advantage when used in the manner taught in the present invention, namely, above the floating gate, as shown in FIG. 3e.

Next, a second polysilicon layer is formed over the substrate, including over the second nitride layer, to a thickness between about 1500 to 2000 Å. Then, the second polysilicon layer is etched to form a poly-2 spacer (170), which will serve as a control gate to a word-line, as shown in FIG. 3c. It will be noted that the poly-2 spacer, that is, the word line is self-aligned to the source region to be formed below in the substrate. A top view of the substrate at this step is shown in FIG. 2c.

Figure 2D:
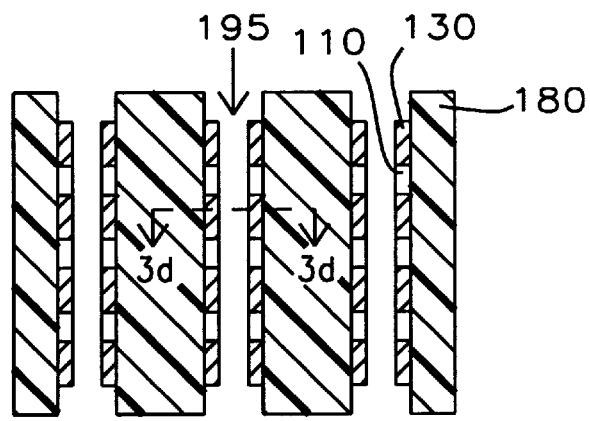
Figure 2E:
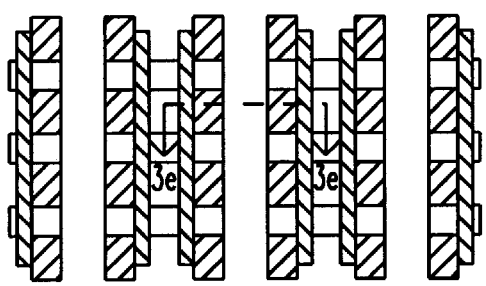
Figure 3D:
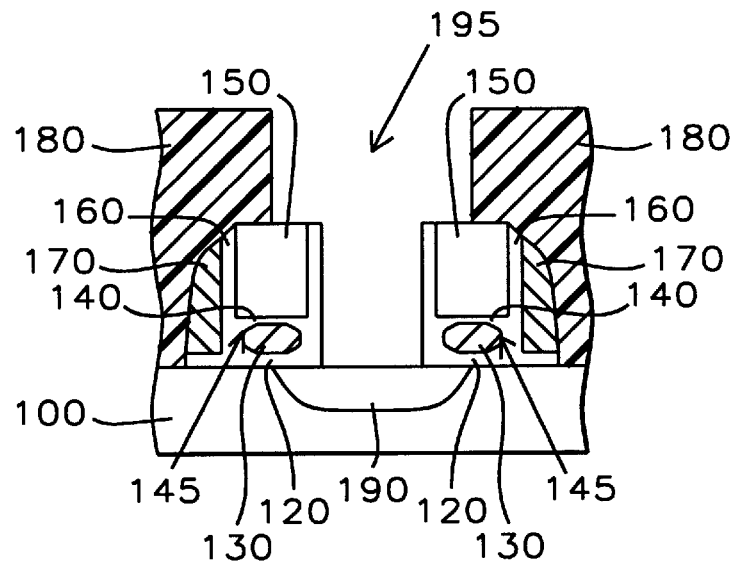
Figure 3E:
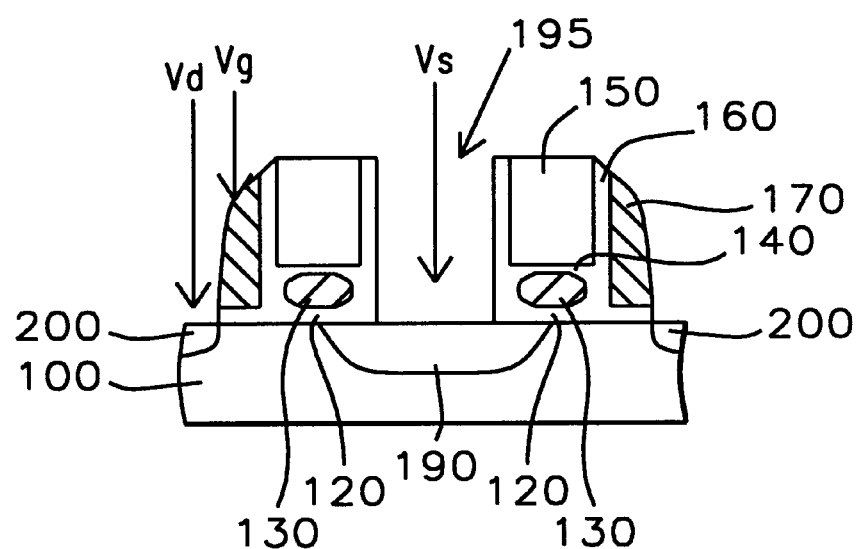
Figure 3F:
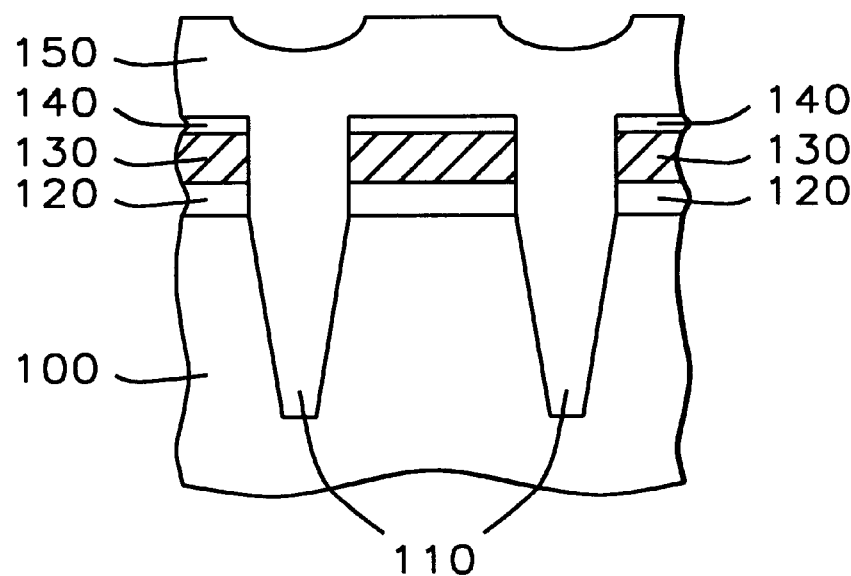

A second photoresist layer reference numeral (180) in FIGS. 2d and 3d is formed over the substrate to form a second photoresist mask with a pattern to remove portions of poly-2 (180) and isolation oxide (110) over the STI region to form source line (195). While the isolation oxide is removed from areas exposed in STI regions, the other portions that are protected by the second nitride layer, such as the floating gate, remain unaffected, as is seen in FIG. 3d. In other words, a self-aligned source etch is accomplished, as another important aspect of the instant invention. A source implant using phosphorus ions is next performed at a dosage level between about $1\times10^{15}$ to $1\times10^{16}$ atoms/cm$^2$, and energy level between about 20 to 60 KeV to form source (190) shown in FIG. 3d. The second photoresist mask is then removed using conventional methods such as oxygen plasma ashing, and the source region is annealed to affect lateral diffusion and form coupling between the source and floating gate. The completion of the split-gate is accomplished by performing drain implant by using phosphorus ions at a dosage level between about $1\times10^{15}$ to $1\times10^{16}$ atoms/cm$^2$, and energy level between about 20 to 60 KeV to form drain (200) shown in FIG. 3e.

The voltage levels corresponding to those shown in FIG. 3e for the programming and erasing of the presently disclosed split-gate flash memory cell are given in the table below:

|  | Vd | Vg | Vs |
| --- | --- | --- | --- |
| Programming | 1 V | 2 | 9.5 |
| Erasing | 0 V | 11 | 0 |

Thus, three levels of self-alignment is disclosed in the instant invention, namely, that of the cell to the trench isolation, of the floating gate to the source line, and the floating gate to the control gate or the wordline. Furthermore, a thin floating gate is used to form a thin and sharp poly tip through the use of a "smiling effect" to advantage. The tip substantially decreases the coupling ratio of the floating gate to the word line for fast erasing speed, while at the same time increasing the coupling of the source to the floating gate with the attendant increase in the programming speed of the split gate flash memory cell.

While the invention has been particularly shown and described with reference to the preferred embodiments thereof, it will be understood by those skilled in the art that various changes in form and details may be made without departing from the spirit and scope of the invention.

What is claimed is:

1. A method of forming a multi-self-aligned structure for a split-gate flash comprising the steps of:
   providing a semiconductor substrate having shallow trench isolation (STI) formed therein and active regions defined;
   forming a gate oxide layer over said substrate;
   forming a thin floating gate over said gate oxide layer, wherein said floating gate is vertically self-aligned to said STI;
   forming a high temperature oxide (HTO) layer over said thin floating gate;
   forming a thick nitride layer over said HTO layer;
   growing an inter-poly oxide layer over said thick nitride layer, wherein a sharp thin poly tip is formed employing smiling effect in said thin floating gate;
   forming a spacer control gate over said inter-poly oxide wherein said spacer control gate is vertically self-aligned to said floating gate;
   forming a common source line self-aligned to said floating gate and said control gate; and
   forming a drain to complete forming of said split-gate flash memory cell.

2. The method of claim 1, wherein said gate oxide layer has a thickness between about 70 to 100 Å.

3. The method of claim 1, wherein said thin floating gate comprises polysilicon having a thickness between about 50 to 150 Å.

4. The method of claim 1, wherein said HTO layer has a thickness between about 50 to 100 Å.

5. The method of claim 1, wherein said nitride layer has a thickness between about 900 to 1100 Å.

6. The method of claim 1, wherein said inter-poly oxide has a thickness between about 100 to 200 Å.

7. The method of claim 1, wherein said spacer control gate comprises polysilicon having a thickness between about 1500 to 3000 Å.

8. The method of claim 1, wherein said forming a common source is accomplished by implanting phosphorus ions at a dosage level between about $1\times10^{15}$ to $1\times10^{16}$ atoms/cm$^2$ at an energy between about 20 to 60 KeV.

9. The method of claim 1, wherein said forming said drain is accomplished by implanting phosphorus ions at a dosage level between about $1\times10^{15}$ to $1\times10^{16}$ atoms/cm$^2$ at an energy between about 20 to 60 KeV.

10. A method of forming a multi-self aligned structure for a split-gate flash comprising the steps of:
    providing a semiconductor substrate;
    forming a gate oxide layer over said substrate;
    forming a first polysilicon layer over said gate oxide layer;
    forming a first nitride layer over said first polysilicon layer;
    forming shallow trench isolation (STI) and defining active regions in said substrate;
    forming isolation oxide in said STI;
    forming high temperature oxide (HTO) over said substrate;
    forming second nitride layer over said HTO layer;
    forming a first photoresist mask to define a floating gate;
    etching said second nitride layer, said HTO layer, and underlying said first polysilicon layer through said first photoresist mask to form a floating gate, wherein said floating gate is vertically self-aligned to said STI;
    removing said first photoresist mask;
    growing inter-poly oxide layer over said second nitride layer, wherein a sharp thin poly tip is formed employing smiling effect in said floating gate;
    forming a second polysilicon layer over said substrate, including over said inter-poly oxide layer;
    etching said second polysilicon layer to form a spacer control gate;
    forming a second photoresist mask over said substrate;
    removing portions of said second polysilicon layer and isolation oxide over source line region;
    forming a common source self-aligned to said floating gate and said spacer control gate;
    removing said second photoresist mask; and
    forming a drain to complete forming of said split-gate flash memory cell.

11. The method of claim 10, wherein said gate oxide layer is formed at a temperature between about 750 to 950° C., and has a thickness between about 70 to 100 Å.

12. The method of claim 10, wherein said first polysilicon layer is formed through LPCVD method employing silane SiH$_4$ as a silicon source material at a temperature between about 550 to 650° C. to a thickness between about 50 to 150 Å.

13. The method of claim 10, wherein said first nitride layer is formed by reacting dichlorosilane (SiCl$_2$H$_2$), or silane (SiH$_4$), with ammonia (NH$_3$) in an LPCVD chamber at a temperature between about 650 to 800° C., having a thickness between about 1400 to 1600 Å.

14. The method of claim 10, wherein said isolation oxide is an LPCVD oxide having a thickness between about 2500 to 4500 Å.

15. The method of claim 10, wherein said HTO layer is formed at a temperature between about 750 to 900° C. and to a thickness between about 50 to 100 Å.

16. The method of claim 10, wherein said second nitride layer has a thickness between about 900 to 1100 Å.

17. The method of claim 10, wherein said inter-poly oxide is grown at a temperature between about 750 to 900° C., and has a thickness between about 100 to 200 Å.

18. The method of claim 10, wherein said second polysilicon layer has a thickness between about 1500 to 3000 Å.

19. The method of claim 10, wherein said forming a common source is accomplished by implanting phosphorus ions at a dosage level between about $1\times10^{15}$ to $1\times10^{16}$ atoms/cm$^2$ at an energy between about 20 to 60 KeV.

20. The method of claim 10, wherein said forming said drain is accomplished by implanting phosphorus ions at a dosage level between about $1\times10^{15}$ to $1\times10^{16}$ atoms/cm$^2$ at an energy between about 20 to 60 KeV.

* * * * *